United States Patent [19]

Gregorian et al.

[11] 4,393,351

[45] Jul. 12, 1983

[54] OFFSET COMPENSATION FOR SWITCHED CAPACITOR INTEGRATORS

[75] Inventors: Roubik Gregorian, Santa Clara; Glenn Wegner, San Jose, both of Calif.

[73] Assignee: American Microsystems, Inc., Santa Clara, Calif.

[21] Appl. No.: 287,387

[22] Filed: Jul. 27, 1981

[51] Int. Cl.$^3$ .......................... G06G 7/18; H03K 5/00; H03F 1/02

[52] U.S. Cl. .................................... 328/127; 307/491; 307/497; 330/9

[58] Field of Search ............... 307/491, 490, 493, 494, 307/497; 328/127; 330/9

[56] References Cited

U.S. PATENT DOCUMENTS

| | | | |
|---|---|---|---|
| 4,210,872 | 7/1980 | Gregorian | 330/9 |
| 4,355,285 | 10/1982 | Kelley et al. | 330/9 |
| 4,365,204 | 12/1982 | Haque | 328/127 |

*Primary Examiner*—John S. Heyman
*Assistant Examiner*—Timothy P. Callahan
*Attorney, Agent, or Firm*—Alan H. MacPherson; Steven F. Caserza; Richard Franklin

[57] ABSTRACT

An integrator circuit utilizing an operational amplifier (19) and switched capacitor elements (11, 13 and 16) in place of resistors in such a manner as to provide compensation for voltage offsets present in the operational amplifier resulting in an output voltage ($V_{OUT}$) free from the effects of voltage offsets inherent in operational amplifiers.

6 Claims, 7 Drawing Figures

FIG. 4
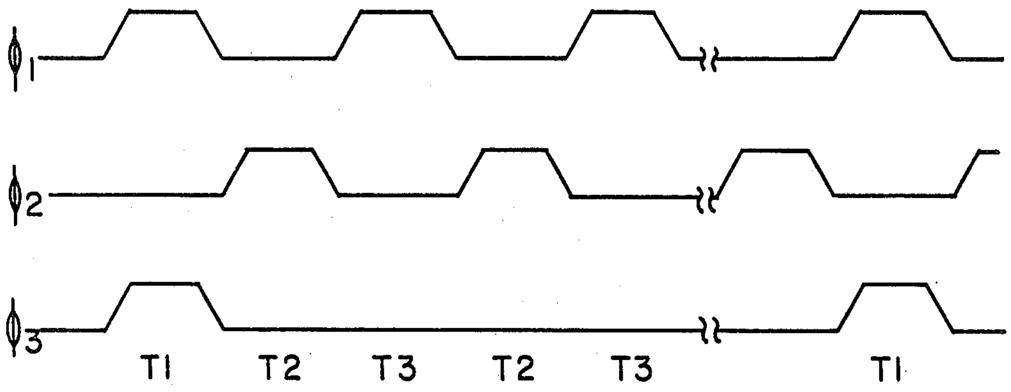
FIG. 5a
FIG. 5b
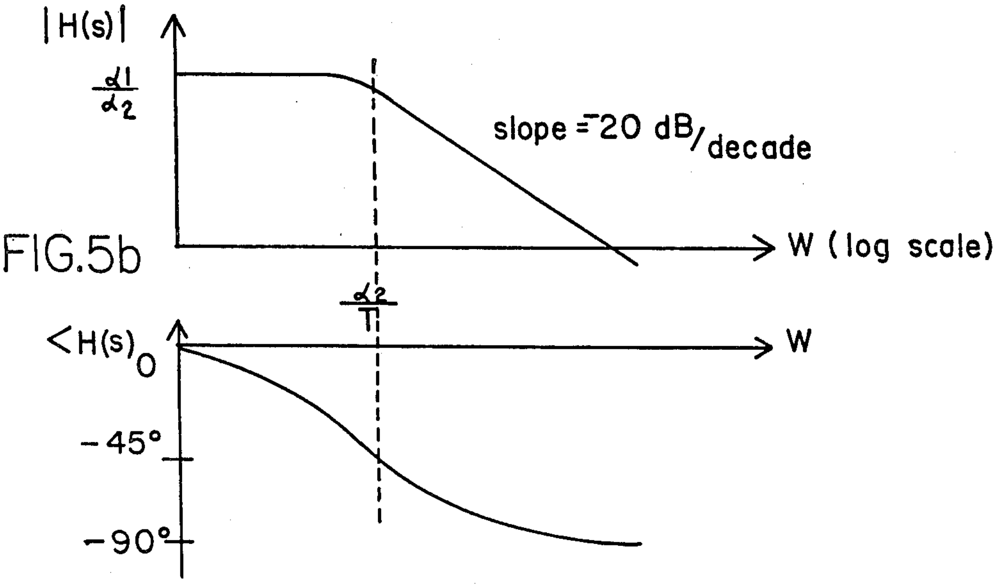

OFFSET COMPENSATION FOR SWITCHED CAPACITOR INTEGRATORS

BACKGROUND OF THE INVENTION

1. Field of the Invention

This invention relates to the use of electronic circuits as integrators and more specifically to means for eliminating errors in the output voltage of the integrator due to offset voltages inherent in operational amplifiers used in integrators.

2. Description of the Prior Art

Prior art integrators are well known. The simplest form of integrator utilizing an operational amplifier (shown in FIG. 1) requires a capacitive element 14 with capacitance C to act as a path for negative feedback from the output lead 15 of the operational amplifier 13 to its inverting input lead 9. A resistive element 12 with resistance R is connected in series between the input voltage to be integrated and said inverting input lead 9 of the operational amplifier. The time constant T for such an integrator is simply $$T=RC. \quad (1)$$

Switch 25 is connected in parallel across capacitor 14 in order to initialize the integrator by discharging capacitor 14. An ideal operational amplifier 13 will always have inverting input lead 9 at the same potential as noninverting input lead 8, which is connected to ground in the circuit of FIG. 1. An ideal operational amplifier will therefore have its output lead 15 at ground potential as well, when switch 25 is closed. Thus, after initialization has been completed by discharging capacitor 14 through closed switch 25, an ideal operational amplifier connected as shown in FIG. 1 may begin integrating the voltage applied at terminal 11, and the result of the integration will appear on output lead 15 of operational amplifier 13.

Prior art operational amplifiers are well-known. Fabrication tolerances result in component mismatches, thus providing each operational amplifier with its own unique inherent offset voltage $V_{off}$. This offset voltage is defined as the output voltage of the operational amplifier when the amplifier is in the unit gain mode (inverting input lead and output lead connected) and its noninverting input lead grounded. Because each operational amplifier has its own unique offset voltage, each circuit utilizing such an operational amplifier must compensate in a unique manner for the inherent offset voltage associated with that specific operational amplifier.

Actual operational amplifiers are imperfect in that the output voltage contains an error component known as the offset voltage ($V_{OFF}$). Offset voltages exist due to finite component mismatches within the operational amplifiers. Thus in the circuit of FIG. 1 if operational amplifier 13 is an actual operational amplifier rather than an ideal operational amplifier, the initialized voltage appearing on output lead 15 and inverting input lead 9 of operational amplifier 13 with switch 25 closed will not be zero but will be the offset voltage, $V_{OFF}$. This causes the output voltage available on lead 15 to be consistently erroneous by a factor of $V_{OFF}$. Because the magnitude of $V_{OFF}$ is unique for each individual operational amplifier circuit due to unique component mismatches, elimination of the effects of $V_{OFF}$ is difficult to obtain when manufacturing a large number of circuits. For this reason, operational amplifiers constructed as individual integrated circuits generally have external pins utilized specifically for applying external voltages, as generated by external circuitry, to null the offset voltage of the operational amplifier. However, integrators contained as a subcircuit of an integrated circuit chip do not provide the end user with external access to the operational amplifier unless additional pins on the integrated circuit package are specifically made available for this purpose. In all but the most rare circumstances this is totally impractical. It is also undesirable to require external circuitry to eliminate $V_{OFF}$.

In the construction of metal oxide silicon (MOS) semiconductor devices, values of resistors and capacitors are not highly controllable. Thus in the integrator circuit shown in FIG. 1 with the time constant equal to RC, circuits constructed utilizing MOS techniques will possess unpredictable time constants.

In practice, resistors are generally formed by diffusion, resulting in resistance values and resistance ratios which are not highly controllable. Capacitors are formed by utilizing layers of conductive material, such as metal or polycrystalline silicon, as capacitor plates. Each plate of conductive materials is separated by a layer of electrical insulation material, such as $SiO_2$ or silicon nitride, serving as a dielectric from another conductive layer or from a conductive substrate. While capacitor areas are quite controllable, dielectric thickness is not. However, this is not fatal from a circuit point of view because while capacitance values are not highly controllable, ratios of capacitance values are, since dielectric thickness is quite uniform across a single semiconductor die.

One method of circumventing the problem of uncontrollable RC time constants in MOS devices is to replace each resistor with a switched capacitor, as described by Caves, et al., in "Sampled Analog Filtering Using Switched Capacitors As Resistor Equivalents", IEEE JSSC, Volume SC-12, Number 6, December 1977. One such switched capacitor resistor equivalent is shown in FIG. *2a*. Terminals 71 and 75 are available as equivalents to the terminals available on a resistor. Capacitor 74 has a capacitance value of C. Switch 72 is connected in series between input terminal 71 and capcitor 74, and controls when the input voltage is applied to capacitor 74 from terminal 71.

Switch 73 is connected in series between output terminal 75 and capacitor 74, and controls when the voltage stored in capacitor 74 is applied to output terminal 75. In practice, switches 72 and 73 are controlled by two clock generators having the same frequency of operation but generating non-overlapping control pulses. When the clock controlling switch 72 goes high, switch 72 closes, thus causing capacitor 74 to be charged to the input voltage applied to terminal 71. Because the two clock generators are non-overlapping, switch 73 is open during this charge cycle. Switch 72 then opens. Then switch 73 closes, while switch 72 remains open, thus applying the voltage stored on capacitor 74 to terminal 75.

Another switched capacitor resistor equivalent is shown in FIG. *2b*. Terminals 171 and 175 are available as equivalents to the terminals available on a resistor. Capacitor 174 has a capacitance value of C. Switch 172 is connected in series between input terminal 171 and capacitor 174, and controls when the input voltage is applied to capacitor 174 from terminal 171.

Switch 173 is connected between capacitor 174 and ground, and controls when the charge stored in capacitor 174 is removed. In practice, switches 172 and 173 are controlled by two clock generators having the same frequency of operation but generating non-overlapping control pulses. When the clock controlling switch 172 goes high, switch 172 closes, thus causing capacitor 174 to accept charge from the input voltage applied to terminal 171. Because the two clock generators are non-overlapping, switch 173 is open during this charge cycle. Switch 172 then opens. Then switch 173 closes, while the switch 172 remains open, thus discharging capacitor 174 to ground.

The resistor equivalent circuits of FIGS. *2a* and *2b* simulates a resistor having resistance value R given by the following equation:

$$R=t/C_R \quad (2)$$

where t is the period of switches 72 and 73, (FIG. *2a*) and 172–173 (FIG. *2b*) in seconds, and $C_R$ is the capacitance of resistor equivalent capacitor 74 (FIG. *2a*) and capacitor 174 (FIG. *2b*). From equations 1 and 2 we can see that the time constant for the integrator of FIG. 1 utilizing a switched capacitor as a resistor equivalent will be $$T=(tC/C_R) \quad (3)$$

or that the bandwidth will be $$BW=fC_R/C \quad (4)$$

where C is the capacitance of the integrating capacitor 14 and f is the frequency of operation of switch 72 and switch 73 and is equal to 1/t. Since the time constant of an integrator utilizing a switched capacitor as a resistor equivalent is dependent on the ratio of capacitors, it is possible to construct many devices having a uniform capacitance ratio and thus uniform time constants.

A circuit equivalent to the integrator shown in FIG. 1 utilizing switched capacitor resistor equivalents is shown in FIG. 3 of co-pending U.S. patent application Ser. No. 185,356. Of importance, the circuit of FIG. 3 of the co-pending application shows two switches (switch 24 and switch 25) connected to inverting input lead 40 of operational amplifier 48. The connection of a switch to the inverting input lead of an operational amplifier decreases the accuracy of the integrator due to leakage currents caused by each such switch.

Thus, integrators fabricated utilizing MOS techniques have been constructed utilizing switched capacitors in place of resistive elements. Switched capacitor integrators constitute an improvement over integrators utilizing resistive elements due to the fact that resistance values of diffused resistors are not easily controllable in MOS circuits while the ratios of capacitance values are more controllable. However, switched capacitor resistive equivalents have no effect on the inherent offset of the operational amplifiers used in switched capacitor MOS integrators. Thus, output voltage error due to voltage offsets of operational amplifiers are present both in integrators utilizing resistive and capacitive elements and in integrators utilizing switched capacitor elements in place of said resistive elements.

To improve accuracy it is desirable to reduce or eliminate the voltage offsets associated with the output signal of an operational amplifier. One method and structure for eliminating the effect of voltage offsets on the output signal of a switched capacitor integrator is disclosed in co-pending U.S. patent application Ser. No. 185,356 filed Sept. 8, 1980 now U.S. Pat. No. 4,365,204 and assigned to American Microsystems, Inc., the assignee of this invention. U.S. Pat. No. 4,365,204 is hereby incorporated by reference into this application.

SUMMARY

This invention utilizes a unique circuit configuration wherein the offset voltage of the operational amplifier used as part of the integrator is sampled and held each time the input voltage applied to the integrator is sampled. This stored offset voltage is then fed back to the inverting input lead of the integrator in such a manner as to eliminate the effects of the offset voltage of the operational amplifier on the output voltage of the integrator.

Figure 1:
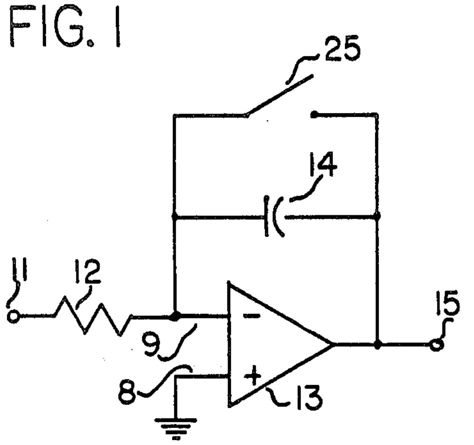
FIG. 1 is a typical prior art integrator utilizing resistive and capacitive elements.
Figure 2A:
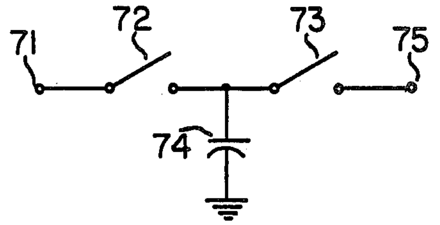
Figure 2B:
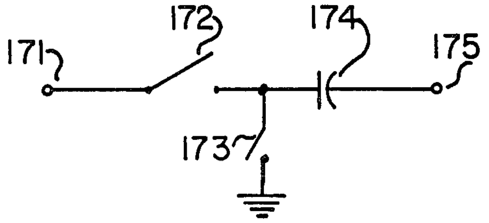
Figure 3:
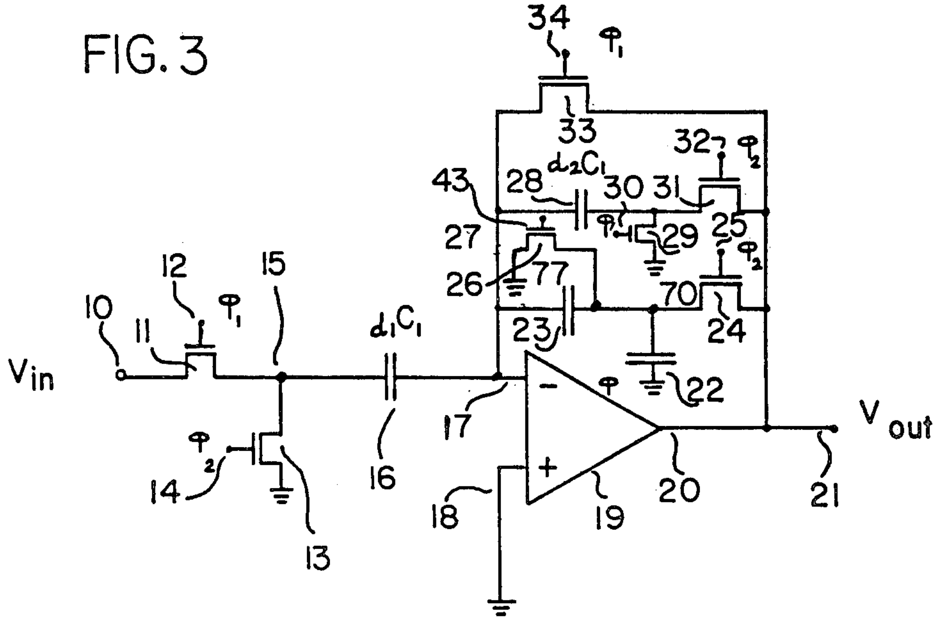

FIGS. *2a* and *2b* illustrate two resistor equivalent circuits utilizing switched capacitor techniques;

FIG. 3 is a schematic diagram of the circuit of this invention;

FIG. 4 is a graphical representation of the three clock generator signals used to control the circuit of FIG. 3;

FIG. *5a* is a graph depicting the gain of the integrator of this invention with respect to frequency; and FIG. *5b* is a graph depicting the phase of the output signal of the integrator of this invention with respect to frequency.

DETAILED DESCRIPTION

The present invention (shown in FIG. 3) utilizes only one switch (switch 33) connected to inverting input lead 17 of operational amplifier 19, thus minimizing inaccuracies due to leakage currents on inverting input lead 17. Capacitor 23, having capacitance value of $C_1$, provides negative feedback from output lead 20 to inverting input lead 17 of operational amplifier 19. Switch 26 is connected between capacitor 23 and ground to provide means for discharging capacitor 23 and thus reinitializing the integrator. Non-inverting input lead 18 of operational amplifier 19 is connected to ground. Capacitor 16 together with switches 11 and 13 provide the switched capacitor resistor equivalent. Capacitor 16 has a capacitance value of $\alpha_1 C_1$.

The operation of the circuit of FIG. 3 requires three separate control signals. Periodic clock signals suitable for this purpose are shown in FIG. 4. $\phi_3$ is used to drive switch 26 and has a frequency of $f_3$. For each positive going pulse of $\phi_3$, switch 26 is closed, thereby discharging capacitor 23 to $V_{OFF}$ and reinitializing the integrator. The frequency $f_1$ of $\phi_1$ is equal to an integral multiple of that of $\phi_3$, such that $f_1=Nf_3$. Typically N equals on the order of 1000. $\phi_2$ runs at the same frequency as $\phi_1$ such that $f_2$ equals $f_1$. As shown in FIG. 4 however, while $\phi_2$ has the same frequency as $\phi_1$, it is delayed in such a manner that $\phi_1$ and $\phi_2$ are nonoverlapping clock signals of the same frequency. In actual practice, $\phi_3$ may be supplied from other circuits and need not be a periodic clock, as long as $\phi_1$ and $\phi_2$ do not overlap.

During initialization (time $T_1$) of the circuit of FIG. 3, both $\phi_1$ and $\phi_3$ go high at the same time as shown in FIG. 4. $\phi_3$ controls switch 26 such that a positive going pulse on $\phi_3$ will cause switch 26 to close, thus discharging capacitor 23 to $V_{OFF}$ and reinitializing the integrator. $\phi_1$ controls switches 11, 29 and 33 such that a positive going pulse on $\phi_1$ causes switches 11, 29 and 33 to close. $\phi_2$ controls switches 13, 24 and 31 suh that a positive going pulse on $\phi_2$ causes switches 13, 24 and 31 to close. During the reinitialization period of the integration cycle, $\phi_1$ is high, $\phi_2$ is low and $\phi_3$ is high. Thus switch 26 is closed, switches 11, 29 and 33 are closed and switches 13, 24 and 31 are open. The output lead 20 of operational amplifier 19 is connected to the inverting input terminal 17 of operational amplifier 19 through closed switch 33, thus placing operational amplifier 19 in the unity gain mode and forcing inverting input 17 to $V_{OFF}$, the magnitude of the offset voltage of operational amplifier 19. Capacitor 23 and capacitor 28 are thus charged to $V_{OFF}$. Capacitor 23 has a capacitance $C_1$ and capacitor 28 has a capacitance value of $\alpha_2C_1$. The values $\alpha_1$ and $\alpha_2$ are selected in order to achieve a lossy integrator (i.e. an integrator including a resistive feedback loop from the operational amplifier output to the inverting input lead of the operational amplifier) which will possess the transfer function desired for the particular purpose for which the lossy integrator will be used, as will become apparent below. At the same time capacitor 16 is charged to $V_{IN}(1)-V_{OFF}$, where $V_{IN}(1)$ is the input voltage applied to terminal 10 during the first sample period.

At time $T_2$, $\phi_3$ goes low, thus causing switch 26 to open, with capacitor 23 remaining at $V_{OFF}$. $\phi_1$ goes low causing switches 11, 29 and 33 to open leaving ($V_{IN}$(1)-$V_{OFF}$) stored on capacitor 16 and $V_{OFF}$ stored on capacitor 28. $\phi_2$ then goes high with $\phi_1$ and $\phi_3$ both low, thus causing switches 13, 24 and 31 to close.

The following is the charge conservation equation applicable to inverting input lead 17 at time $T_2$:

$$\alpha_1C_1[(0-V_{OFF})-(V_{IN}(N)-V_{OFF})]+\alpha_2C_1[(V_{OUT}(N)-V_{OFF})-(0-V_{OFF})]+C_1[(V_{OUT}(N)-V_{OFF})-(V_{OUT}(N-1)-V_{OFF})]=0 \quad (5)$$

or:

$$(1+\alpha_2)V_{OUT}(N)-V_{OUT}(N-1)=\alpha_1V_{IN}(N) \quad (6)$$

where $V_{OUT}$(N)=The output voltage on terminal 21 at the end of the Nth clock cycle ($\phi_2$ high);

$V_{OUT}$(N−1)=The output voltage on terminal 21 at the end of the (N−1)th clock cycle ($\phi_2$ high) and which is equal to zero immediately after initialization;

$V_{IN}$(N)=The input voltage from terminal 10 stored on capacitor 16 at the end the Nth clock cycle ($\phi_1$ high).

Referring again to FIG. 4, at time $T_3$ $\phi_2$ goes low thus causing switches 13, 24 and 31 to open. $\phi_1$ then goes high, causing switches 11, 29 and 33 to close, charging capacitor 16 to ($V_{IN}(2)-V_{OFF}$) and charging capacitor 28 to $V_{OFF}$. $\phi_1$ then goes low causing switches 11, 29 and 33 to open. $\phi_2$ then goes high causing switches 13, 24 and 31 to close, resulting in ($V_{IN}(2)-V_{OFF}$) (stored in capacitor 16) being applied in parallel with $V_{OFF}$ (stored in capacitor 28) to the inverting input of operational amplifier 19. Again, the charge conservation equations (5) and (6) hold true, but with a different argument (N). The integration cycle comprising times $T_2$ and $T_3$ is repeated for the integration of each input voltage sample $V_{IN}$(N). When the integrator is to be initialized (ie., integration capacitor $C_1$ discharged), the initialization cycle comprising time $T_1$ is repeated.

Capacitor 22, having a capacitance valve C, is not essential to this invention, although it serves an important function when used. During the period when $\phi_2$ is high, switch 24 is closed, thus connecting capacitor 22 between output lead 20 of operational amplifier 19 and ground. Thus, $V_{OUT}$ is stored on capacitor 22 during each clock cycle. At the same time, ($V_{OUT}-V_{OFF}$) is stored on capacitor 23. During the periods when $\phi_2$ is low and thus switch 24 is off, leakage currents through switch 24 tend to discharge capacitor 23. By the use of capacitor 22 connected to node 70, capacitor 22, as well as capacitor 23, is partially discharged due to the leakage currents through non-conducting switch 24. By the proper sizing of capacitor 22, the effect of leakage currents through switch 24 on the charge stored on capacitor 23 will be negligible. For example, the capacitance of capacitor 23 is typically less than one picofarad. Thus, by making the capacitance of capacitor 22 equal to two to three picofarads, or more, capacitor 22 will provide a much greater portion of the leakage currents through non-conducting transistor 24 than will capacitor 23, thus reducing the discharge of integration capacitor 23 compared to this discharge if capacitor 22 is not used. As shown in the charge conservation equations (5) and (6), capacitor 22 has no effect on the output voltage $V_{OUT}$ of the integrator, other than preventing the discharge of capacitor 23. Thus, the inclusion of capacitor 22, while not absolutely necessary, improves the accuracy of the integrator stage by minimizing the effect of leakage currents on integration capacitor 23. During reinitialization of the integrator, $\phi_3$ is high, switch 26 is closed, and capacitor 22 (if used) is discharged.

The operation of the above-described circuit can be more effectively explained in terms of the well-known Z transform. The following Z transforms are well-known and are described, for example, in Modern Control Engineering, by OGATA, published by Prentice-Hall, Inc., 1970, particularly on page 63:

$$V(N) \longleftrightarrow V(Z) \quad (7)$$

$$V(N+1) \longleftrightarrow ZV(Z) \quad (8)$$

$$V(N-1) \longleftrightarrow Z^{-1}V(Z) \quad (9)$$

Substituting these Z transforms into equation (6) gives:

$$V_{OUT}(Z)\,[1+\alpha_2-Z^{-1}]=\alpha_1V_{IN}(Z) \quad (10)$$

or $$H(Z)=\frac{V_{OUT}(Z)}{V_{IN}(Z)}=\frac{\alpha_1}{1+\alpha_2-Z^{-1}} \quad (11)$$

or $$H(Z)=\frac{\alpha_1}{1+\alpha_2}\cdot\frac{Z}{Z-\frac{1}{1+\alpha_2}} \quad (12)$$

Using Equation (11) and the well-known Euler's Z to S transformation approximations:

$$Z \longleftrightarrow \frac{1}{1-sT} \text{ and } Z^{-1} \longleftrightarrow 1-sT$$

gives the frequency response of the integrator of this invention:

$$H(s) = \frac{\alpha_1}{1 + \alpha_2 - (1 - sT)} \tag{13}$$

$$H(s) = \frac{\alpha_1}{\alpha_2} \cdot \frac{1}{(ST/\alpha_2) + 1} \tag{14}$$

Thus, the integrator of this invention has a DC gain $$(S \longleftrightarrow O)$$

of $\alpha_1/\alpha_2$ and a single pole at a frequency of $W = \alpha_2/T$. Gain and phase plots for the integrator of this invention are given in FIGS. 5a and 5b, respectively.

Thus by utilizing well-known techniques to minimize parasitic capacitance and parasitic charge injection in MOS transistors used as switches (such as those described in U.S. Pat. No. 4,365,204), and by utilizing the circuit of this invention, a switched capacitor integrator is constructed which internally compensates for the undesired and often intolerable effects of the offset voltages characteristic of operational amplifiers used in integrators. By selecting the values $\alpha_1$ and $\alpha_2$, and thus the size of capacitors 16, 23 and 28, the integrator of this invention is formed having a desired transfer function. Naturally, the desired transfer function will depend on the specific use to which the integrator of this invention is to be put.

I claim:

1. An integrator containing an integrator input terminal and an integrator output terminal comprising:

an operational amplifier having an inverting input lead, a non-inverting input lead, and an output lead, said operational amplifier producing an offset voltage on said output lead;

a first switch means responsive to a first phase of a signal having two phases, said first switch means connected between said inverting input lead and said output lead;

a first capacitor, having a capacitance $C_1$, having a first and a second plate, said first plate connected to said inverting input lead of said operational amplifier;

a second switch means, responsive to a second phase of said signal having two phases, said second switch means connected between said second plate of said first capacitor and said output lead of said operational amplifier;

a second capacitor, having capacitance value $\alpha_2 C_1$, having a first and a second plate, said first plate connected to said inverting input lead of said operational amplifier;

third switch means, responsive to said second phase, said switch means connected between said second plate of said second capacitor and said output lead of said operational amplifier;

a fourth switch means, responsive to said first phase, said fourth switch means connected between said second plate of said second capacitor and a voltage reference; and switched capacitor means connected between said inverting input lead and said integrator input terminal, said switched capacitor means serving as a resistor equivalent and including a third capacitor having a first and a second plate, said third capacitor having capacitance $\alpha_1 C_1$;

whereby the effect of said offset voltage on the integrator output voltage available on said output terminal is eliminated by the simultaneous integration of said input voltage and said offset voltage during the period when said first clock phase is low and said second clock phase is high.

2. Structure as in claim 1 wherein said switched capacitor means comprises:

a fifth switch means, responsive to said first phase, said fifth switch means being connected between said integrator input terminal and said first plate of said third capacitor;

a sixth switch means, responsive to said second phase, said sixth switch means being connected between said first plate of said third capacitor and a voltage reference; and said second plate of said third capacitor being connected to said inverting input lead of said operational amplifier.

3. Structure as in claim 2 wherein during said first phase said operational amplifier is placed in the unity gain mode and said offset voltage $V_{OFF}$ is stored in said second capacitor and an input voltage $V_{IN}$ is sampled and held (by said switched capacitor means with a voltage equal to $V_{IN} - V_{OFF}$ being stored on said third capacitor and during said second phase said offset voltage stored in said second capacitor and said input voltage stored in said third capacitor are integrated.

4. Structure as in claim 1 further comprising a seventh switch means, responsive to a third signal, said seventh switch means being connected between said voltage reference and said second plate of said first capacitor, whereby said first capacitor is discharged in response to said third signal.

5. Structure as in claim 1 further comprising a fourth capacitor, having a capacitance C, said fourth capacitor having a first plate connected to said second plate of said first capacitor and a second plate connected to a voltage reference.

6. Structure as in claims 1, 2, 3, 4 or 5 wherein the transfer function of said integrator is $$H(Z) = \frac{\alpha_1}{1 + \alpha_2} \cdot \frac{Z}{Z - \frac{1}{1 + \alpha_2}}$$

* * * * *

UNITED STATES PATENT AND TRADEMARK OFFICE
CERTIFICATE OF CORRECTION

PATENT NO. : 4,393,351

DATED : July 12, 1983

INVENTOR(S) : Roubik Gregorian, et al.

It is certified that error appears in the above—identified patent and that said Letters Patent is hereby corrected as shown below:

Column 1, Line 45, change "unit" to --unity--.

Column 5, Line 4, change "suh" to --such--.

Signed and Sealed this

*Fifth* Day of *June 1984*

[SEAL]

*Attest:*

GERALD J. MOSSINGHOFF

*Attesting Officer* *Commissioner of Patents and Trademarks*